(12) United States Patent
Ying et al.

(10) Patent No.: US 8,664,676 B2
(45) Date of Patent: Mar. 4, 2014

(54) LED PACKAGE STRUCTURE HOUSING A LED AND A PROTECTIVE ZENER DIODE IN RESPECTIVE CAVITIES

(75) Inventors: Tsung-Kang Ying, Taipei (TW); Chung-Hsien Yu, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 763 days.

(21) Appl. No.: 12/917,612

(22) Filed: Nov. 2, 2010

(65) Prior Publication Data

US 2011/0186870 A1 Aug. 4, 2011

(30) Foreign Application Priority Data

Jan. 29, 2010 (CN) .................. 2010 2 0114146 U

(51) Int. Cl.
*H01L 33/54* (2010.01)
*H01L 33/60* (2010.01)

(52) U.S. Cl.
USPC ........ 257/98; 257/99; 257/100; 257/E33.058; 257/E33.059; 257/E33.072

(58) Field of Classification Search
USPC .................. 257/98–100, E33.058, E33.059, 257/E33.072
See application file for complete search history.

(56) References Cited

U.S. PATENT DOCUMENTS

| 7,462,871 B2 * | 12/2008 | Han et al. ................... 257/81 |
| 2004/0159850 A1 * | 8/2004 | Takenaka ................... 257/98 |
| 2010/0059782 A1 * | 3/2010 | Fujitomo et al. ............. 257/98 |

* cited by examiner

*Primary Examiner* — Marcos D. Pizarro
(74) *Attorney, Agent, or Firm* — Rosenberg, Klein & Lee

(57) ABSTRACT

An LED package structure includes a base and two diodes. The base includes an insulating layer having an outer peripheral edge, and a conductive bottom layer disposed on a bottom face of the insulating layer and having an outer peripheral edge spaced from the outer peripheral edge of the insulating layer at a predetermined distance. The insulating layer is formed with two spaced-apart through holes, and cooperates with the conductive bottom layer to form first and second cavities. The diodes are disposed within the first and second cavities, respectively. A transparent encapsulant covers the base and the diodes.

13 Claims, 4 Drawing Sheets

LED PACKAGE STRUCTURE HOUSING A LED AND A PROTECTIVE ZENER DIODE IN RESPECTIVE CAVITIES

CROSS-REFERENCE TO RELATED APPLICATION

This application claims priority of Chinese Application No. 201020114146.6, filed on Jan. 29, 2010.

BACKGROUND OF THE INVENTION

1. Field of the Invention

This invention relates to an LED (light-emitting diode) package structure, more particularly to a LED package structure with a thin design.

2. Description of the Related Art

Referring to FIG. 1, a conventional SMD (surface-mount device) LED package structure 9 generally places an LED chip 91 on a surface of a printed circuit board (PCB) 92, after which a transparent encapsulant 93 covers the LED chip 91 and is cured by a molding process, thereby sealing the LED chip 91.

The conventional LED package structure 9 has the following drawbacks:

1. When the transparent encapsulant 93 includes a phosphor material or is a colored encapsulant, a polarity of the package structure 9 cannot be directly distinguished, thereby causing difficulties in the assembly of the package structure 9 with a sired electronic device.

2. Since the LED chip 91 is placed on the surface of the printed circuit board 92, the thickness the transparent encapsulant 93 must be larger than that of the LED chip 91 so as to cover the same. As a result, the thickness of the whole package structure 9 is determined by the thicknesses of the printed circuit board 92 and the transparent encapsulant 93, making it very difficult to minimize thickness.

3. The printed circuit board 92 usually has an insulating layer 921 at a middle portion thereof, so that it has a poor heat-conductive effect. Thus, heat emitted by the LED chip 91 is transmitted through a metal layer 922 on the surface of the printed circuit board 92. As shown by the arrows in FIG. 1, heat is transmitted from a top surface of the printed circuit board 92 down to the sides, and from the sides to a lower surface of the printed circuit board 92, so that heat is transmitted along a long path and cannot be quickly dissipated. Accumulation of heat will adversely affect an illuminating efficiency and the lifetime of the LED chip 91.

Further, the currently available LED package structure 9 is mostly suitable for packaging only one LED chip 91, so that the range of application of the same is limited.

From the aforesaid description, it is apparent that the LED package structure 9 still has room for improvement.

SUMMARY OF THE INVENTION

Therefore, an object of the present invention is to provide an LED package structure that has two cavities for disposal of two diodes therein, respectively, that has a thickness that can be reduced to a minimum, and that can enhance acceleration of heat dissipation.

Another object of the present invention is to provide an LED package structure that includes an insulating layer, and a conductive bottom layer having an outer peripheral edge that is spaced apart from an outer peripheral edge of the insulating layer at a predetermined distance to prevent formation of burrs and occurrence of poor wetting.

According to this invention, an LED package structure comprises a base, two diodes, and a transparent encapsulant. The base includes an insulating layer having an outer peripheral edge, and a conductive bottom layer disposed on a bottom face of the insulating layer and having an outer peripheral edge spaced from the outer peripheral edge of the insulating layer at a predetermined distance. The insulating layer is formed with two spaced-apart through holes, and cooperates with the conductive bottom layer to form first and second cavities. The diodes are disposed within the first and second cavities, respectively. The transparent encapsulant covers the base and the diodes.

The efficiency of the present invention is achieved through the presence of the two cavities which can receive simultaneously either two light emitting diodes or one light emitting diode and one Zener diode, thereby enhancing the anti-static capability of the present invention. The outer peripheral edge of the conductive bottom layer and the outer peripheral edge of the insulating layer are spaced apart from each other at a predetermined distance to prevent formation of burrs and occurrence of poor wetting. Moreover, the base includes a solder mask providing an anti-weld effect and allowing easy polarity recognition. Additionally, the cavities permit the light emitting diodes to contact directly the conductive bottom layer, thereby shortening the path of heat transmission and accelerating dissipation of heat. With the light emitting diodes disposed in the respective cavities, the thickness of the transparent encapsulant can be reduced, so that the thickness of the whole LED package structure is minimized.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
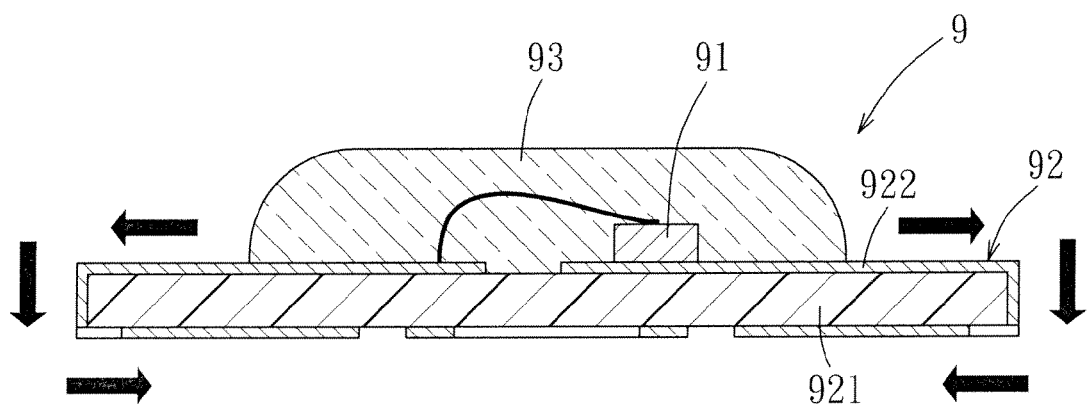
FIG. 1 is a sectional view of a conventional LED package structure.

The above-mentioned and other technical contents, features, and effects of this invention will be clearly presented from the following detailed description of two preferred embodiments in coordination with the reference drawings.

Before this invention is described in detail, it should be noted that, in the following description, similar elements are designated by the same reference numerals.

Figure 2:
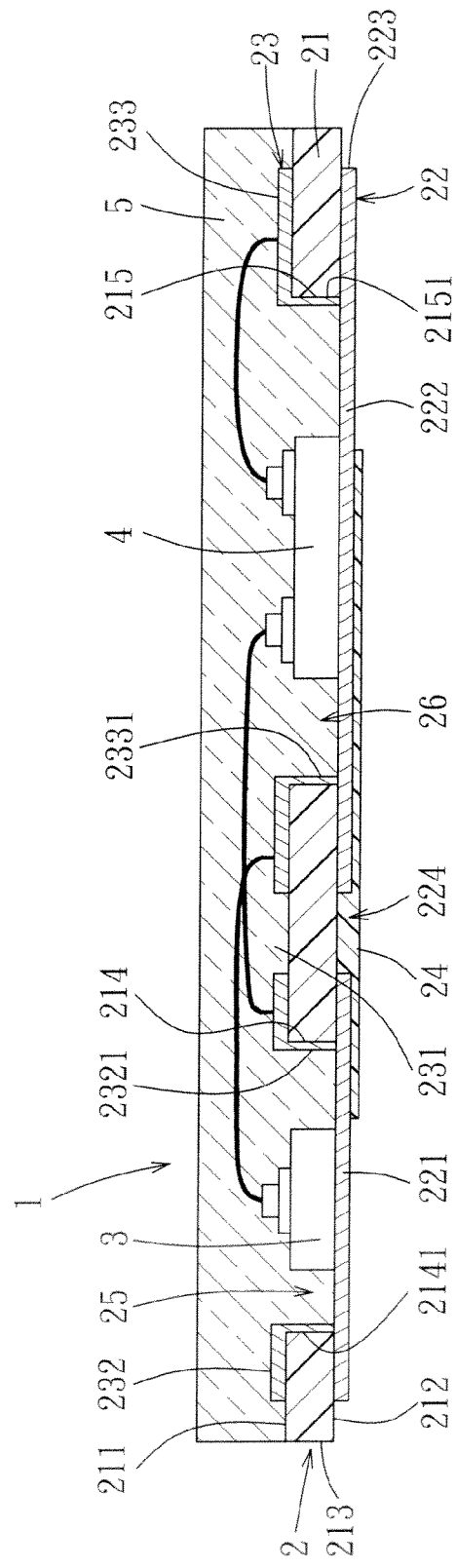
FIG. 2 is a sectional view of a LED package structure according to the first preferred embodiment of the present invention.
Figure 3:
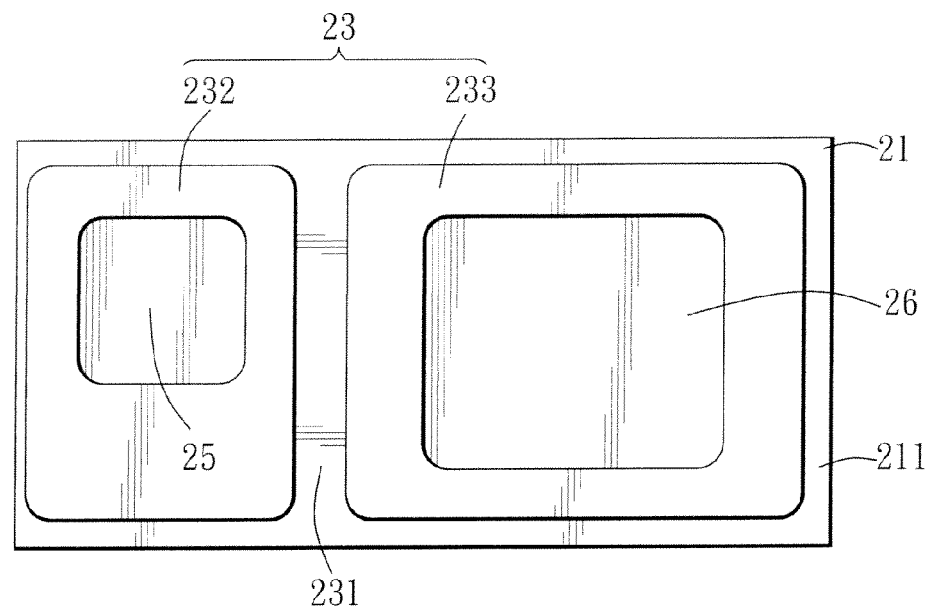
FIG. 3 is a schematic top view of a base of the first preferred embodiment.
Figure 4:
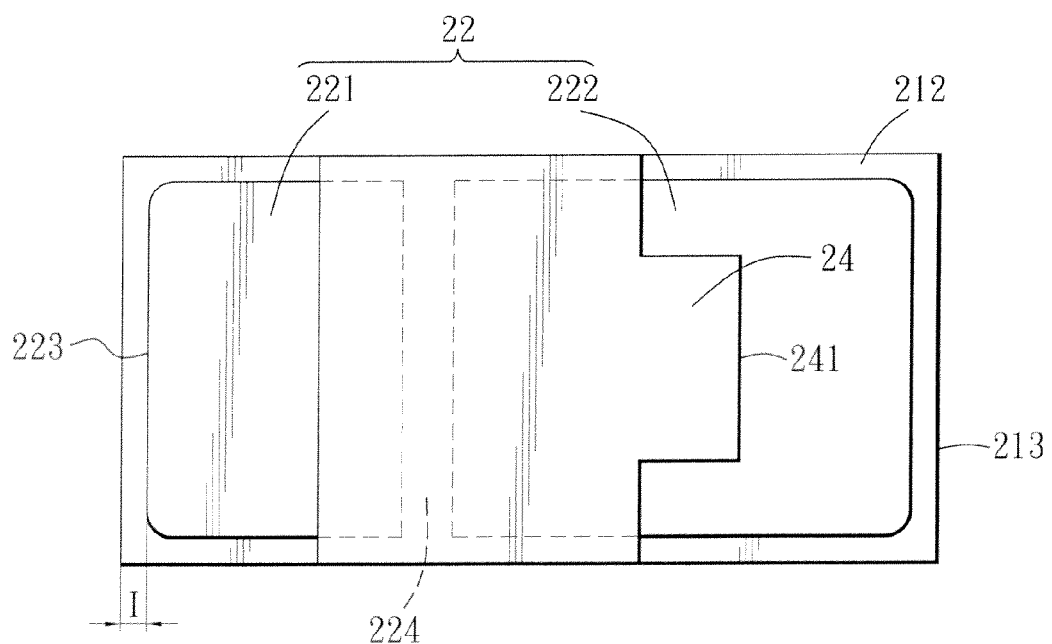
FIG. 4 is a schematic bottom view of the base of the first preferred embodiment.

Referring to FIGS. 2, 3, and 4, a LED package structure 1 according to the first preferred embodiment of the present invention comprises a base 2, a Zener diode 3, a light emitting diode (LED) 4, and a transparent encapsulant 5. The present invention may employ a surface mount technology so as to be installed on a circuit board of an electronic device.

The base 2 includes an insulating layer 21, a conductive bottom layer 22, a conductive top layer 23, and a solder mask 24. The insulating layer 21 has a top face 211, a bottom face 212, and an outer peripheral edge 213 interconnecting end peripheries of the top and bottom faces 211, 212. The insulating layer 21 is formed with two spaced-apart first and second through holes 214, 215 that extend through the and bottom faces 211, 212 thereof.

The conductive bottom layer 22 is disposed on the bottom face 212 of the insulating layer 21, and cooperates with peripheral walls 2141, 2151 that respectively define the first and second through holes 214, 215 to form first and second cavities 25, 26. The conductive bottom layer 22 includes a first area 221 and a second area 222 that are spaced apart and electrically disconnected from each other and that cooperate with the insulating layer 21 to define thereamong a first disconnection area 224. The first area 221 defines a bottom portion of the first cavity 25. The second area 222 defines a bottom portion of the second cavity 26. In this embodiment, the first area 221 has a polarity opposite to that of the second area 222. That is, the first area 221 is a first positive polarity area, and the second area 222 is a first negative polarity area. In other embodiment, the first area 221 could be a negative polarity area, and the second area 222 could be a positive polarity area.

The solder mask 24 covers completely the first disconnection area 224, and covers partially the first area or first positive polarity area 221 and the second area or first negative polarity area 222. The solder mask 24 prevents electrical connection between the first positive polarity area 221 and the first negative polarity area 222 during soldering. A width of the solder mask 24 from the first positive polarity area 221 to the first negative polarity area 222 is preferably at least 0.4 mm. This effectively prevents electrical connection between the first positive polarity area 221 and the first negative polarity area 222 during soldering. Because tin solder will not attach to the solder mask 24, through use of the solder mask 24, a solder pad pattern is formed in the area that is not covered by the solder mask 24. Further, the solder mask 24 has an extension portion 241 that extends outwardly from a central portion of the solder mask 24 disposed on the first negative polarity area 222 and that extends away from the first disconnection area 224. The purpose of the extension portion 241 is for polarity recognition so as to enhance the recognition rate of an operator or an automated machine. In other embodiment, the extension portion 241 could be disposed on the first positive polarity area 221 and that extends away from the first disconnection area 224.

The conductive bottom layer 22 has an outer peripheral edge 223 spaced from the outer peripheral edge 213 of the insulating layer 21 at a predetermined distance (I). The predetermined distance (I) between the outer peripheral edges 223, 213 of the conductive bottom layer 22 and the insulating layer 21 is preferably in the range of 0.025~0.1 mm. If the conductive bottom layer 22 is made of metal which has good ductility, such as copper, the outer peripheral edge 223 of the conductive bottom layer 22 easily produces burrs, thereby leading to poor wetting during soldering. Through the indention of the outer peripheral edge 223 of the conductive bottom layer 22 from the outer peripheral edge 213 of the insulating layer 21, the chance of contact of the outer peripheral edge 223 of the conductive bottom layer 22 with an external object can be minimized, thereby preventing formation of burrs. In this embodiment, the package structure 1 is rectangular, and has surface dimensions of 1.6 mm×0.8 mm, which is also the dimensions of the outer peripheral edge 213 of the insulating layer 21, a top surface area, and a bottom surface area of 1.28 mm$^2$ (1.6 mm×0.8 mm). Further, the distance (I) between the outer peripheral edges 223, 213 of the conductive bottom layer 22 and the insulating layer 21 is 0.05 mm, the first positive polarity area 221 and the first negative polarity area 222 are spaced apart from each other by 0.07 mm (that is, the width of the first disconnection area 224 is 0.07 mm), and the area of the conductive bottom layer 22 is about 1 mm$^2$. Hence, the area of the conductive bottom layer 22 occupies about 78.2% of the bottom surface area of the package structure 1, and after the solder mask 24 is covered on the conductive bottom layer 22, the conductive bottom layer 22 still has an exposed portion that occupies about 53.9% of the bottom surface area of the package structure 1.

Based on the aforesaid description, since the distance (I) is preferably in the range of 0.025~0.1 mm, if the surface dimensions of the package structure 1 are 1.6 mm×0.8 mm, the conductive bottom layer 22 then occupies about 60~90% of the bottom surface area of the package structure 1, so that after the solder mask 24 is covered on the conductive bottom layer 22, the exposed portion of the conductive bottom layer 22 can still occupy about 45~70% of the bottom surface area of the package structure 1.

If the surface dimensions of the package structure 1 are increased to 3.2 mm×1.6 mm, the distance (I) can still be maintained in the range of 0.025~0.1 mm, the conductive bottom layer 22 can then occupy about 80~95% of the area of the package structure 1, so that after the solder mask 24 is cove the conductive bottom layer 22, the exposed area of the conductive bottom layer 22 can still occupy about 70~80% of the bottom surface area of the package structure 1, thereby providing a very large range of conductive area and effectively enhancing the heat dissipation effect.

The conductive top layer 23 is disposed on the top face 211 of the insulating layer 21, and includes a third area 232 and a fourth area 233 that are spaced apart and electrically disconnected from each other. The third area 232 has a polarity opposite to the fourth area 233. In this embodiment, the third area 232 is a second positive polarity area, and the fourth area 233 is a second negative polarity area. The third area or second positive polarity area 232 and the fourth area or second negative polarity area 233 correspond in position to the first positive polarity area 221 and first negative polarity area 222, respectively. The second positive polarity area 232 and the second negative polarity area 233 cooperate with the insulating layer 21 to define thereamong a second disconnection area 231. The second disconnection area 231 is located opposite to the first disconnection area 224. The second positive polarity area 232 has an extension part 2321 extending along the peripheral wall 2141 of the first through hole 214 so as to connect electrically with the first positive polarity area 221. The second negative polarity area 233 has an extension part 2331 extending along the peripheral wall 2151 of the second through hole 215 so as to connect electrically with the first negative polarity area 222.

Each of the conductive bottom and top layers 22, 23 may be made of a single metal, such as copper, or may be made by stacking a plurality of metal layers, such as tungsten (W), nickel (Ni), and gold (Au) or silver (Ag). Further, the conductive bottom and top layers 22, 23 may be made of the same or different materials.

The Zener diode 3 and the light emitting diode 4 are disposed within the first and second cavities 25, 26, respectively, and are mounted respectively on the first positive polarity area 221 and the first negative polarity area 222 of the conductive bottom layer 22. The Zener diode 3 has a positive electrode connected directly and electrically to the first positive polarity area 221, and a negative electrode connected electrically to the second negative polarity area 233 through a wire bonding process. The negative electrode of the Zener diode 3 is further connected electrically to the first negative polarity area 222 through the second negative polarity area 233. The light emitting diode 4 is connected electrically to the second positive polarity area 232 and the second negative polarity area 233 through a wire bonding process. The light emitting diode 4 is further connected electrically to the first positive polarity area 221 and the first negative polarity area 222 through the second positive polarity area 232 and the second negative polarity area 233, respectively. In this embodiment, the Zener diode 3 is disposed within the first cavity 25 to strengthen an anti-static function of the present invention. Alternatively, an additional light emitting diode may be replaceably disposed within the first cavity 25 in other embodiments.

Figure 5:
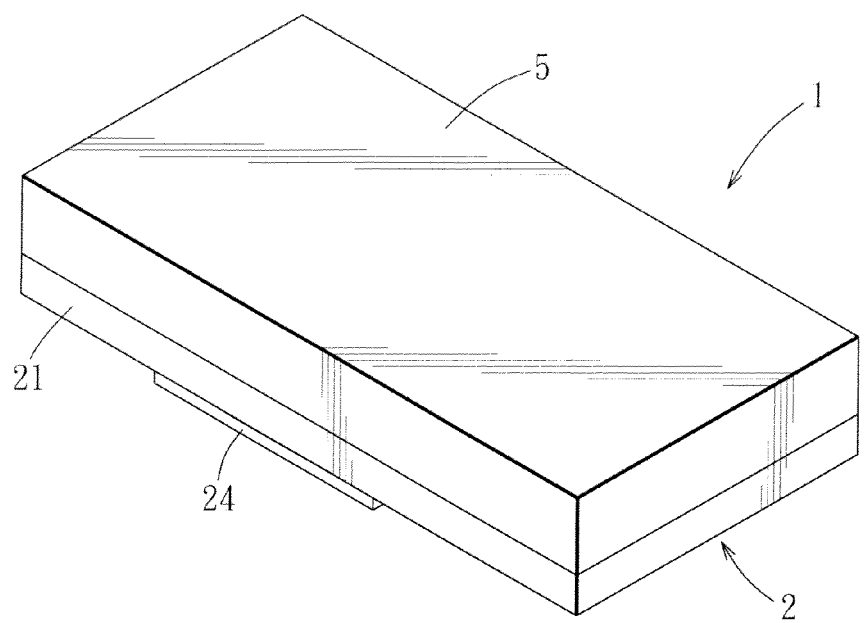
FIG. 5 is a perspective view of the first preferred embodiment.

With reference to FIGS. 2 and 5, the transparent encapsulant 5 covers the base 2, and seals the Zener diode 3 and the light emitting diode 4 in the base 2. The transparent encapsulant 5 is mixed with phosphor and then cooperates with the light emitting diode 4 to produce white light. If the light emitting diode 4 is used to emit a color light, there is no need to mix the transparent encapsulant 5 with phosphor.

Figure 6:
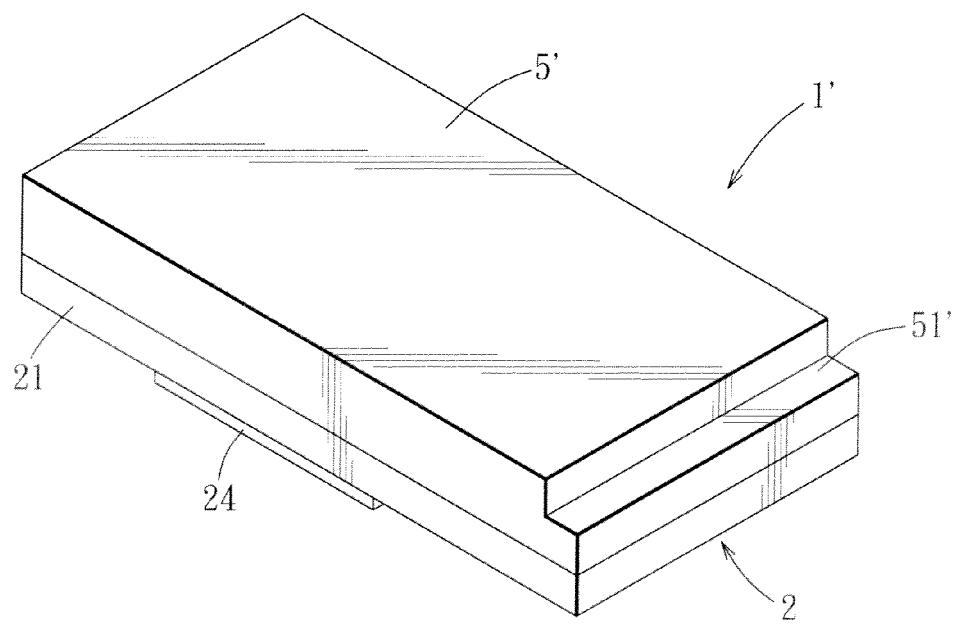
FIG. 6 is a perspective view of a LED package structure according to the second preferred embodiment of the present invention.

Referring to FIG. 6, a LED package structure 1' according to the second preferred embodiment of the present invention is shown to be similar to the first preferred embodiment. However, in this embodiment, the transparent encapsulant 5' has an indentation 51' at one end thereof that is opposite to the first negative polarity area 222 (see FIG. 2) for the purpose of polarity recognition. Since the transparent encapsulant 5' and the solder mask 24 are located respectively on top and bottom sides of the package structure 1', the package structure 1' is provided with a double polar recognition function.

In the aforesaid embodiments, the base 2 is made by using a preformed plate body which has top and bottom metal layers 23, 22, and an insulating layer 21 clamped between the top and bottom metal layers 23, 22. A portion of the top metal layer 23 and a portion of the insulating layer 21 of the preformed plate body are moved so that the insulating layer 21 is formed with the first and second through holes 214, 215 (see FIG. 2) and cooperates with the conductive bottom layer 22 to form the first and second cavities 25, 26. Afterwards, the peripheral walls 2141, 2151 of the first and second through holes 214, 215 undergo a plated through-hole (PTH) operation so as to metallize the peripheral walls 2141, 2151 to thereby facilitate a subsequent manufacturing process. The peripheral walls 2141, 2151 are deposited or electroplated with metal layers (that is, the extension parts 2321 and 2331), so that the conductive top and bottom layers 23, 22 are connected electrically to each other. Thereafter, a portion of the conductive bottom layer 22 is removed, so that the outer peripheral edge 223 of the conductive bottom layer 22 is indented from the outer peripheral edge 213 of the insulating layer 21 by the predetermined distance (I), and is formed with the first disconnection 224, the first positive polarity area 221, and the first negative polarity area 222. Another portion of the conductive top layer 23 is removed to form the second disconnection area 231, the second positive polarity area 232, and the second negative polarity area 233. At a predetermined area of the conductive bottom layer 22 is formed the solder mask 24, for example, by coating a solder-resist en paint on the predetermined area of the conductive bottom layer 22 using an ink printing process. The making of the base 2 is completed after the solder mask 24 has cured. The Zener diode 3 and the light emitting diode 4 are mounted on the conductive bottom layer 22 within the first and second cavities 25, 26 using a conventional chip-bonding process. After wire bonding, the transparent encapsulant 5, 5' covers the base 2, thereby sealing the Zener diode 3 and the light emitting diode 4 in the base 2.

In summary, the LED package structure 1, 1' of the present invention has first and second cavities 25, 26 which can receive respectively and simultaneously one light emitting diode 4 and one Zener diode 3 so as to enhance an anti-static capability of the package structure 1, 1', or, alternatively, can respectively receive two light emitting diodes 4. The outer peripheral edge 223 of the conductive bottom layer 22 is indented from the outer peripheral edge 213 of the insulating layer 21 at the predetermined distance (I) so as to prevent formation of burrs and occurrence of poor wetting. Further, the solder mask 24 provides an anti-weld effect, and allows for easy polarity recognition. The solder mask 24 together with the transparent encapsulant 5' can achieve a double polarity recognition effect. Moreover, since the light emitting diode 4 is in direct contact with the conductive bottom layer 22, the path of heat transmission can be shortened, thereby accelerating the rate of heat dissipation. Moreover, the thickness of the transparent encapsulant 5, 5' on the surface of the base 2 can be reduced, so that the thickness of the whole package structure 1, 1' can be reduced to a minimum. Hence, the object of the present invention can be realized.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

We claim:

1. An LED package structure, comprising:
    a base including an insulating layer having an outer peripheral edge, and a conductive bottom layer disposed on a bottom face of said insulating layer and having an outer peripheral edge spaced from said outer peripheral edge said insulating layer at a predetermined distance, said insulating layer being formed with two spaced-apart through holes and cooperating with said conductive bottom layer to form first and second cavities;
    two diodes disposed within said first and second cavities, respectively; and
    a transparent encapsulant covering said base and said diodes.

2. The LED package structure of said claim 1, wherein one of said diodes is a light emitting diode, and the other one of said diodes is a Zener diode or another light emitting diode.

3. The LED package structure of claim 1, wherein an outer peripheral edge of said conductive bottom layer is indent relative to an outer peripheral edge of said insulating layer.

4. The LED package structure of claim 1, wherein said predetermined distance between said outer peripheral edge of said conductive bottom layer and said outer peripheral edge of said insulating layer is in the range of 0.025~0.1 mm.

5. The LED package structure of claim 1, wherein said conductive bottom layer includes a first area and a second area that are spaced apart and electrically disconnected from each other, said first area defining a bottom portion of said first cavity, said first area having a polarity opposite to that of said second area, said second area defining a bottom portion of said second cavity, said first area and said second area cooperating with said insulating layer to define thereamong a first disconnection area.

6. The LED package structure of claim 5, wherein said base further includes an solder mask covering completely said first disconnection area and covering partially said first area and said second area.

7. The LED package structure of claim 6, wherein said LED package structure has a top surface area and a bottom surface area, said conductive bottom layer having an exposed portion that occupies about 45~80% of said bottom surface area of said LED package structure.

8. The LED package structure of claim 6, wherein said so mask has an extension portion that extends outwardly from a central portion of said solder mask disposed on said second area and that extends away from said first disconnection area.

9. The LED package structure of claim 8, wherein a width of said solder mask from said first area to said second area is at least 0.4 mm.

10. The LED package structure of claim 8, wherein said base further includes a conductive top layer disposed on a top face of said insulating layer and including a third area and a fourth area that are spaced apart and electrically disconnected from each other and that correspond in position to said first area and said second area, respectively, said third area having a polarity opposite to said fourth area, said third area having an extension part extending along a peripheral wall that defines said first cavity so as to connect electrically with said first area, said fourth area having an extension part extending along a peripheral wall that defines said second cavity so as to connect electrically with said second area.

11. The LED package structure of claim 10, wherein said transparent encapsulant has an indentation at one end thereof that is opposite to said second area.

12. The LED package structure of claim 10, wherein said first area is a first positive polarity area, and said second area is a first negative polarity area.

13. The LED package structure of claim 12, wherein said third area is a second positive polarity area, and said fourth area is a second negative polarity area.

* * * * *